United States Patent
Hsu

(10) Patent No.: US 8,304,828 B2
(45) Date of Patent: Nov. 6, 2012

(54) CLOSED CELL TRENCH POWER MOSFET STRUCTURE

(75) Inventor: Hsiu Wen Hsu, Xinfeng Shiang (TW)

(73) Assignee: Great Power Semiconductor Corp., Taipei County (TW)

( * ) Notice: Subject to any disclaimer, the term of this patent is extended or adjusted under 35 U.S.C. 154(b) by 183 days.

(21) Appl. No.: 12/728,631

(22) Filed: Mar. 22, 2010

(65) Prior Publication Data
US 2011/0227149 A1    Sep. 22, 2011

(51) Int. Cl.
*H01L 29/78*    (2006.01)
(52) U.S. Cl. .................................. 257/330; 257/E21.41
(58) Field of Classification Search .......... 257/330–332, 257/334, 374, E29.121, E29.201, E29.26, 257/E29.262, E21.41
See application file for complete search history.

(56) References Cited

U.S. PATENT DOCUMENTS
2004/0036121 A1* 2/2004 Aoki et al. .................... 257/365
* cited by examiner

*Primary Examiner* — Victor A Mandala
*Assistant Examiner* — Selim Ahmed
(74) *Attorney, Agent, or Firm* — Houtteman Law LLC

(57) ABSTRACT

A closed cell trench MOSFET structure having a drain region of a first conductivity type, a body of a second conductivity type, a trenched gate, and a plurality of source regions of the first conductivity type is provided. The body is located on the drain region. The trenched gate is located in the body and has at least two stripe portions and a cross portion. A bottom of the stripe portions is located in the drain region and a bottom of the cross portion is in the body. The source regions are located in the body and at least adjacent to the stripe region of the trenched gate.

5 Claims, 8 Drawing Sheets

CLOSED CELL TRENCH POWER MOSFET STRUCTURE

BACKGROUND OF THE INVENTION

1. Field of the Invention

This invention relates to a trench power metal oxide semiconductor field effect transistor (MOSFET) structure and a method to fabricate the same, and more particularly relates to a closed cell trench power MOSFET structure and a method to fabricate the same.

2. Description of the Prior Art

Attending with the developing of high frequency circuit applications, the demand of high switching speed transistors is increasing. The transistor structure with higher switching speed is capable to reduce switching loss so as to enhance power efficiency.

FIG. 1A is a schematic view of a typical striped cell trench power MOSFET structure. As shown, the trench power MOSFET structure has an N-type heavily doped substrate 10, a N-type epitaxial layer 12, a P-type body 13, a gate oxide layer 15, a trenched gate 16, and a plurality of source regions 17. The epitaxial layer 12 is formed on the substrate 10. The body 13 is formed on the epitaxial layer 12. The gate oxide layer 15 encircles the trenched gate 16 to separate the trenched gate 16 and body 13. The trenched gate 16 is composed of a plurality of stripe-shaped polysilicon structures, which are located in the body 13 with a predetermined interval. A bottom of the stripe-shaped polysilicon structure is located in the epitaxial layer 12 below the body 13. The source regions 17 located by the both sides of the stripe-shaped polysilicon structures.

FIG. 1B is a schematic view of a typical closed cell trench power MOSFET structure. As shown, the trench power MOSFET structure has an N-type heavily doped substrate 20, a N-type epitaxial layer 22, a P-type body 23, a gate oxide layer 25, a trenched gate 26, and a plurality of source regions 27. The epitaxial layer 22 is located on the substrate 20. The body 23 is located on the epitaxial layer 22. The gate oxide layer 25 encircles the trenched gate 26 to separate the trenched gate 26 and the P body 23. The trenched gate 26 shows a network structure in the body 23 to define a plurality of square areas. The bottom of the trenched gate 26 is located in the epitaxial layer 22 below the body 23. The source regions 27 are located in the square areas defined by the trenched gate 26.

The channel of the closed cell trench power MOSFET structure has a width proportional to the boundary length of the square source regions 27. The channel width of the striped cell trench power MOSFET structure is proportional to a side length of the stripe-shaped source regions 17. In contrast with the striped cell one, the closed cell trench power MOSFET structure featuring a greater channel width per unit surface area has a lower on-resistance (Ron).

However, as gate-to-drain capacitance (Cgd) is concerned, because gate-to-drain capacitance is proportional to the bottom area of the trenched gate 16,26, the trenched gate 26 of the closed cell trench power MOSFET structure occupies a greater surface area than the striped cell one may result in a higher gate-to-drain capacitance.

In conclusion, the closed cell trench power MOSFET structure features lower on-resistance but higher gate-to-drain capacitance in contrast with the striped cell one. The feature of high gate-to-drain capacitance may restrict the switching speed of the transistor structure and hinder the development of high frequency electronic circuit applications. Accordingly, it has become an important issue in the field of the present invention to improve gate-to-drain capacitance of the closed cell trench power MOSFET structure.

SUMMARY OF THE INVENTION

It is a main object of the present invention to reduce gate-to-drain capacitance of the closed cell trench power MOSFET structure by reducing junction area between the trenched gate and the drain region so as to enhance switching speed.

To achieve the above mentioned object, a closed cell trench metal-oxide-semiconductor field effect transistor (MOSFET) structure is provided in the present invention. The closed cell trench MOSFET structure comprises a drain region of a first conductivity type, a body of a second conductivity type, a trenched gate, and a plurality of source regions of the first conductivity type. The body is located on the drain region. The trenched gate is located in the body and has at least two stripe portions and a cross portion, wherein a bottom of the stripe portion is located in the drain region and that of the cross portion is located in the body. The source regions are located in the body and at least adjacent to the stripe portion of the trenched gate.

A method to fabricate a closed cell trench MOSFET structure is also provided in the present invention. The method comprises the steps of: (a) providing a drain region of a first conductivity type; (b) forming a first doped region of a second conductivity type on the drain region; (c) forming a trench in the first doped region, the trench having at least two stripe regions and a cross region, and a bottom thereof being located in the drain region; (d) forming a gate dielectric layer lining inner surfaces of the trench; (e) forming a first polysilicon layer in the trench, and the first polysilicon layer substantially filling the stripe region but having a concave at a middle of the cross region; (f) etching the first polysilicon layer to from a window to expose a bottom of the cross region; (g) forming a second doped region with the second conductivity type adjacent to the bottom of the cross region through the etched first polysilicon layer; and (h) forming a second polysilicon layer to fill the window.

In contrast with the traditional closed cell trench MOSFET structure with a bottom of the trenched gate fully located in the drain region, in the closed cell trench MOSFET structure of the present invention, only the bottom of the stripe portion of the trenched gate is located in the drain region, and the bottom of the cross portion of the trenched gate is located in the body. Thus, the closed cell trench MOSFET structure is capable to effectively reduce junction area between the drain and the gate but maintain the channel width of the MOSFET structure. As a result, gate-to-drain capacitance of the closed cell trench MOSFET structure can be reduced with on-resistance being kept low.

BRIEF DESCRIPTION OF THE DRAWINGS

The present invention will now be specified with reference to its preferred embodiment illustrated in the drawings, in which:

FIGS. 2A to 2J are schematic views showing a method to fabricate a closed cell trench MOSFET structure in accordance with a first embodiment of the present invention, wherein FIGS. 2I and 2J are top view and cross-section view of the closed cell trench MOSFET structure;

DESCRIPTION OF THE PREFERRED EMBODIMENT

The idea of the present invention is to shield the bottom of the cross portion of the trenched gate with the body of the MOSFET structure so as to achieve the object of reducing the junction area between the trenched gate and the drain region but having the width of the channel remained. In one embodiment of the fabrication method provided in the present invention, a polysilicon mask is fabricated to cover the bottom of the stripe region of the trench but leave the bottom of the cross region of the trench exposed by using the feature that the width of the cross region is greater than that of the stripe region. Then, a doped region having a conductivity type identical to the body is formed through the polysilicon mask to shield the bottom of the cross portion of the trenched gate.

Figure 2A:
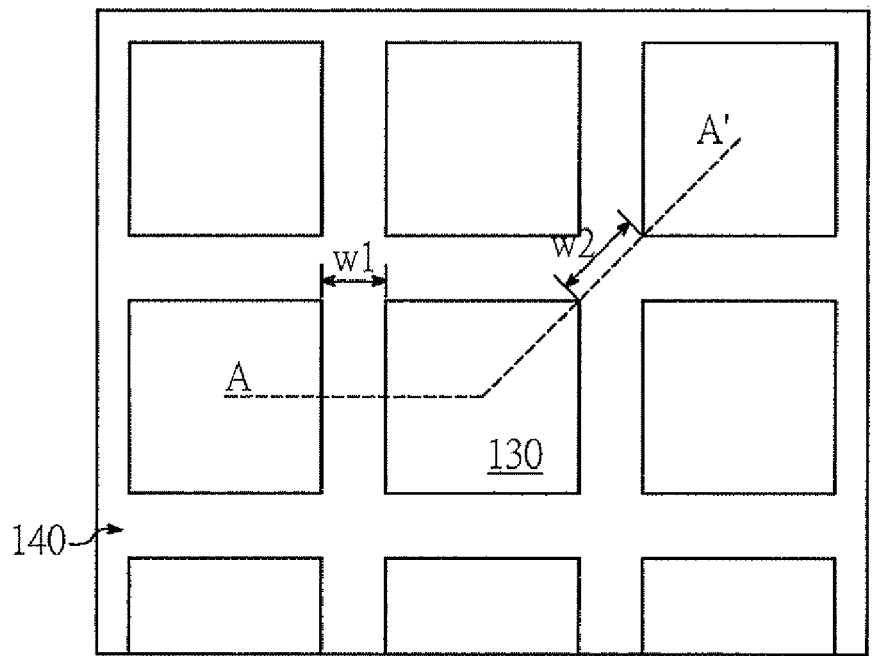
Figure 2B:
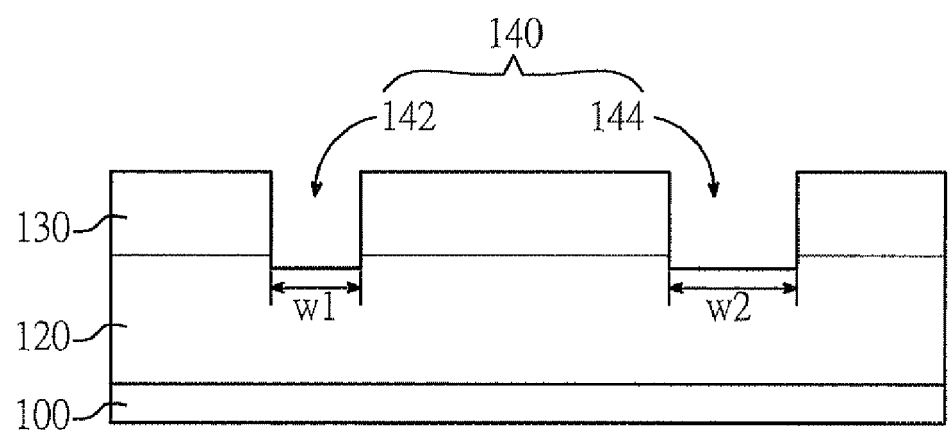
Figure 2C:
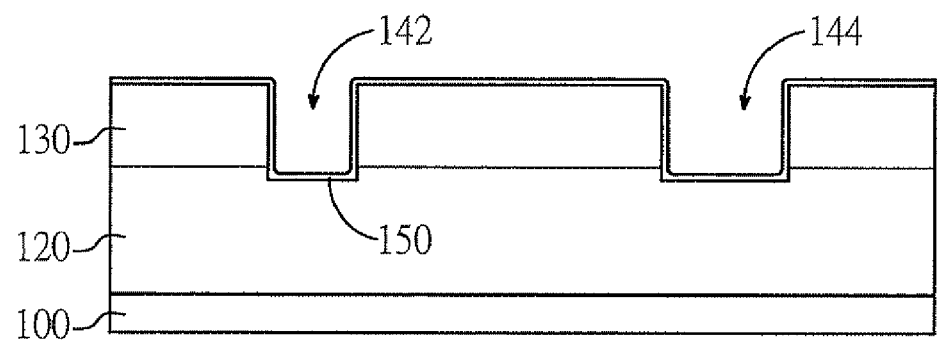
Figure 2D:
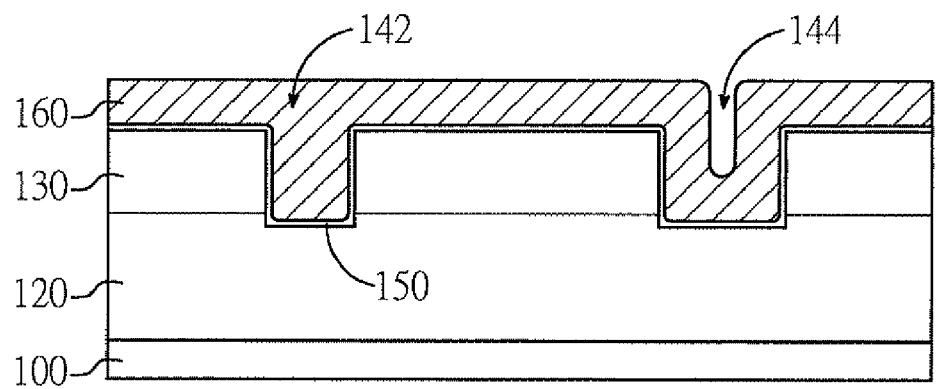
Figure 2E:
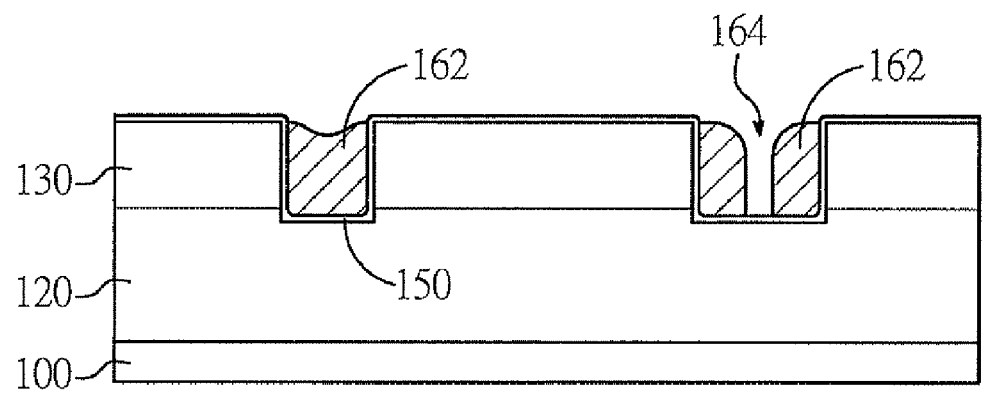
Figure 2F:
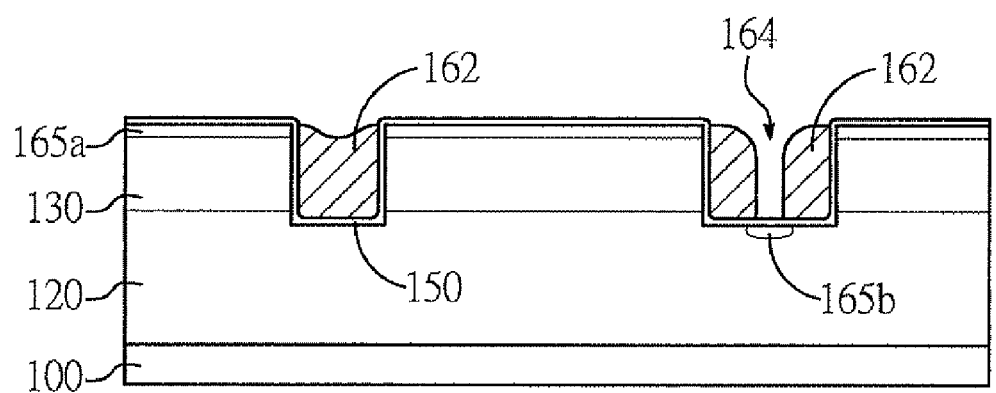
Figure 2G:
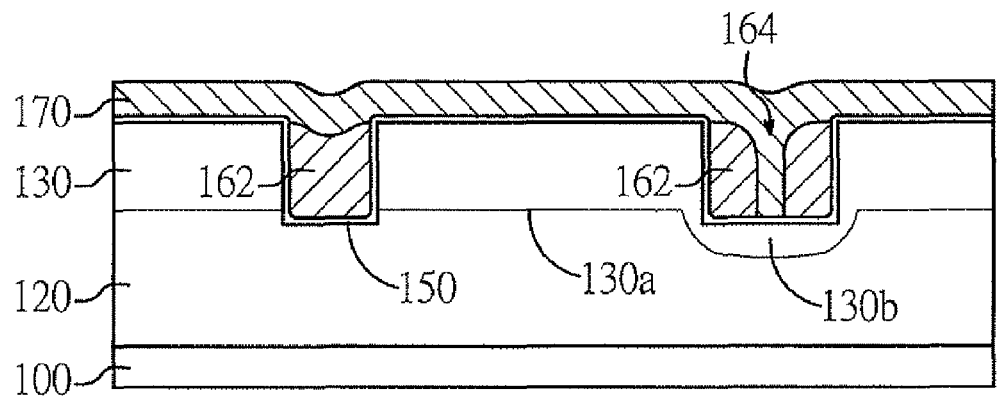
Figure 2H:
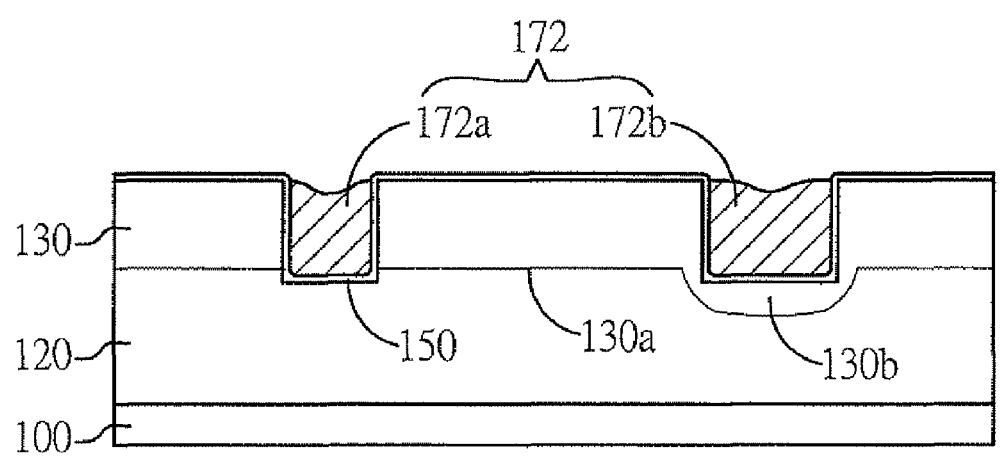
Figure 2I:
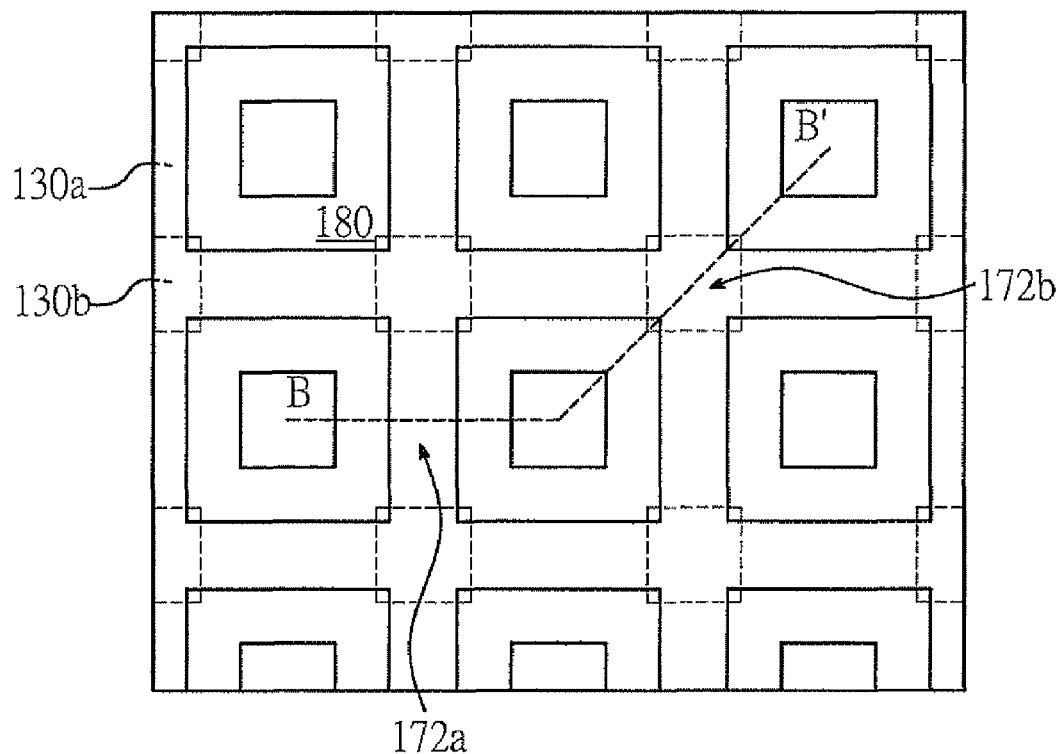
Figure 2J:
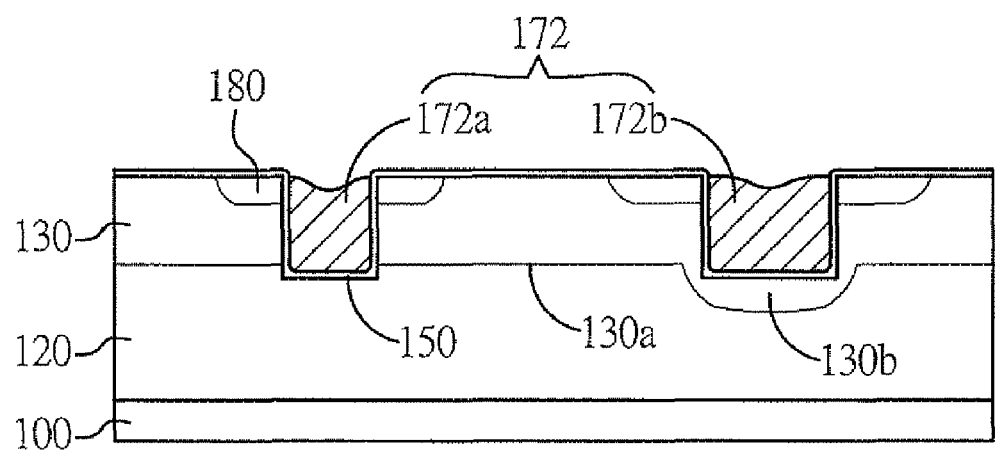

FIGS. 2I and 2J are cross-section view and top view of a closed cell trench MOSFET structure in accordance with a preferred embodiment of the present invention, wherein FIG. 2I is a cross-section view corresponding to B-B' cross section of FIG. 2J.

As shown in FIG. 2I, the closed cell trench MOSFET structure has a drain region of a first conductivity type, a body 130 of a second conductivity type, a trenched gate 172, and a plurality of source regions 180 of the first conductivity type. The drain region is composed of a heavily doped substrate 100 and an epitaxial layer 120. The first conductivity type and the second conductivity type may be N-type and P-type respectively. However, the present invention is not so restricted. The first conductivity type and the second conductivity type may be P-type and N-type also. The body 130 is located on the epitaxial layer 120. The trenched gate 172 is located in the body 130. Also referring to FIG. 2J, the trenched gate 172 has at least two stripe portions 172a and a cross portion 172b. The bottom of the stripe portion 172a is located in the drain region, and the bottom of the cross portion 172b is located in the body 130. The source regions 180 are located in the body 130 and adjacent to the stripe portions 172a of the trenched gate 172.

As shown in FIG. 2J, the stripe portion 172a and the cross portion 172b of the trenched gate 172 are of substantially identical depth. But the body 130 has a flat area 130a and a protruding area 130b on a lower surface thereof. The flat area 130a is corresponding to the stripe portion 172a of the trenched gate 172 and has a depth smaller than that of the stripe portion 172a. The protruding area 130b is corresponding to the cross portion 172b of the trenched gate 172 and has a depth greater than that of the cross portion 172b. That is, the bottom of the stripe portion 172a of the trenched gate 172 may be located in the drain region below the body 130, but the bottom of the cross portion 172b of the trenched gate 172 is located in the body 130 respective to the protruding area 130b.

In the present embodiment, the stripe portion 172a and the cross portion 172b of the trenched gate 172 are of substantially identical depth. However, the present invention is not so restricted. According to another embodiment of the present invention, the stripe portion 172a and the cross portion 172b of the gate 172 may be of different depth as the body 130 corresponded to the protruding area 130b is deep enough to cover the bottom of the cross portion 172b of the trenched gate 172.

Figure 3A:
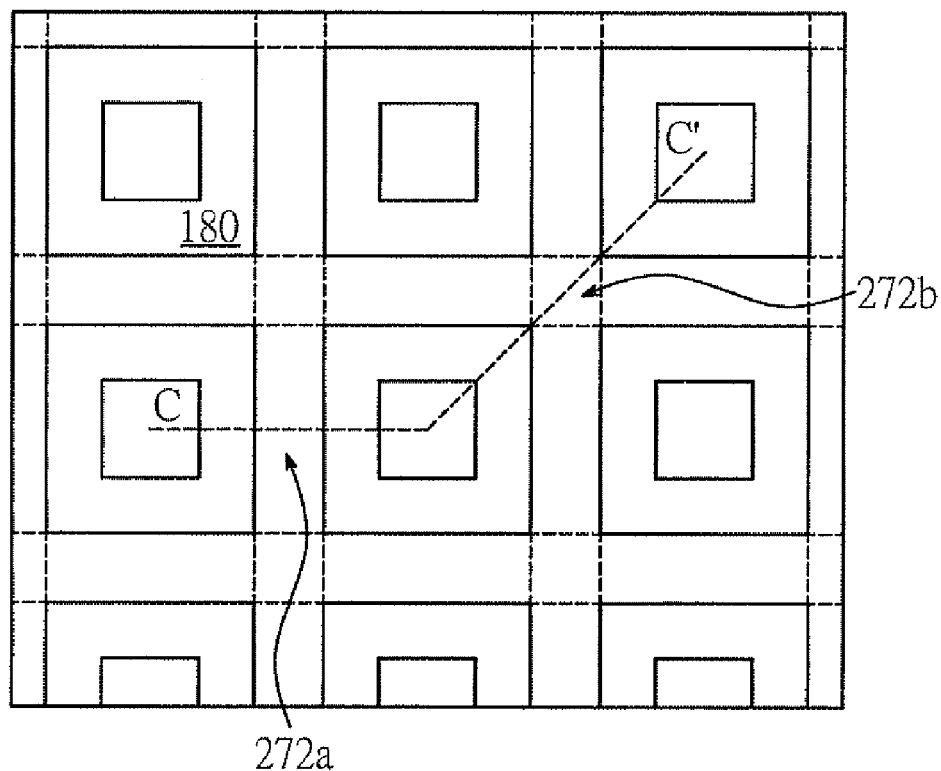
FIGS. 3A to 3B are top view and cross-section view of a closed cell trench MOSFET structure in accordance with a second embodiment of the present invention.
Figure 3B:
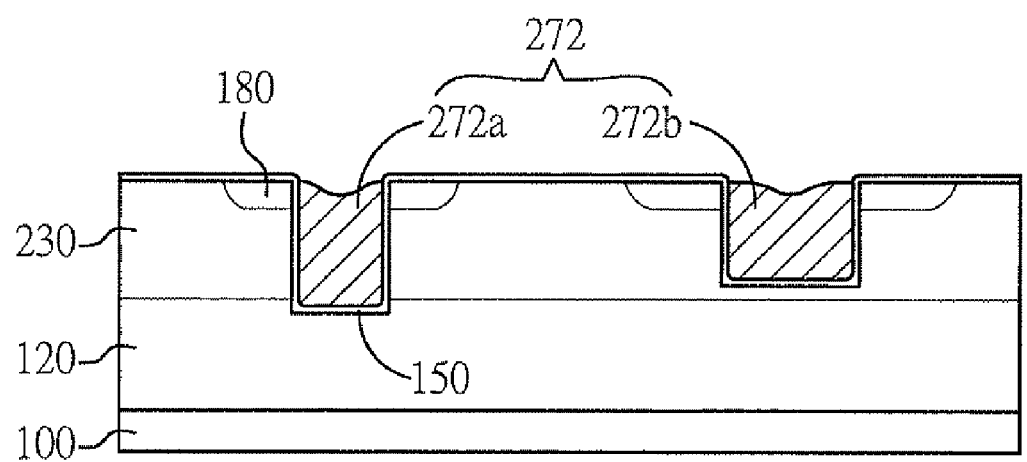

Moreover, in the present embodiment, the body 130 has a protruding area 130b on a lower surface thereof to have the bottom of the cross portion 172b of the trenched gate 172 located within the body 130. However, the present invention is not so restricted. FIGS. 3A and 3B show the second embodiment of the closed cell trench MOSFET structure in accordance with the present invention, wherein FIG. 3B is a cross-section view corresponding to the cross-section C-C' in FIG. 3A. In this embodiment, the lower surface of the body 230 is a flat plane, but the stripe portion 272a and the cross portion 272b of the trenched gate 272 are of different depth. The bottom of the stripe portion 272a is located below the lower surface of the body 230, but the bottom of the cross portion 272b is located above the lower surface of the body 230.

Figure 4:
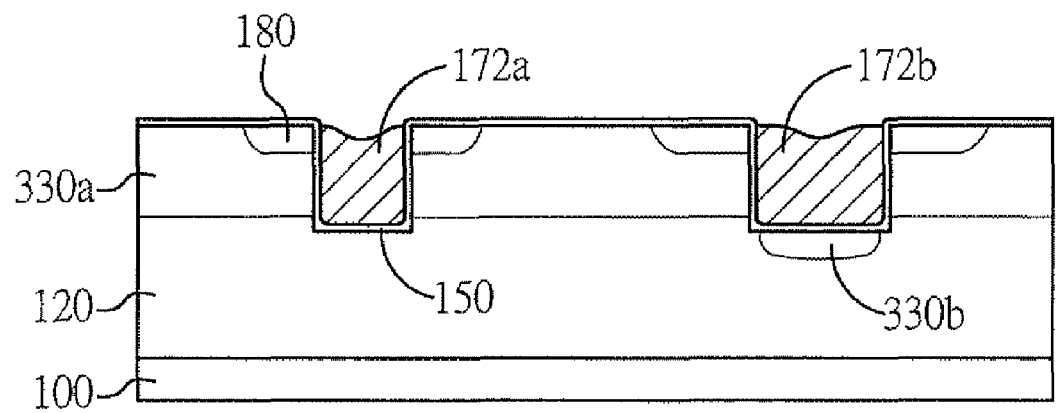
FIG. 4 is a schematic view of a closed cell trench MOSFET structure in accordance with a third embodiment of the present invention.

In the present embodiment, the body 130 has a downward protruding area 130b on a lower surface thereof to shield the bottom of the cross portion 172b of the trenched gate 172. But the present invention is not so restricted. As shown in FIG. 4, in accordance with a third embodiment of the present invention, the body 330 can be separated into a first doped region 330a and at least a second doped region 330b. The second doped region 330b is located below the first doped region 330a and isolated from the first doped region 330a. The trenched gate 172 is located in the first doped region 330a. The bottom of the cross region 172b of the trenched gate 172 is located in the second doped region 330b.

FIGS. 2A to 2J are schematic views showing a method to fabricate a closed cell trench MOSFET structure in accordance with a preferred embodiment of the present invention. FIG. 2B is a cross-section view respective to A-A' cross section in FIG. 2A. Firstly, as shown in FIG. 2B, a substrate 100 of a first conductivity type is provided and an epitaxial layer 120 of the first conductivity type is formed on the substrate 100 to compose a drain region. Thereafter, a body 130 of a second conductivity type is formed on the drain region. Then, a trenched 140 is formed in the body 130. The depth of the trench 140 is greater than that of the body 130 so that the bottom of the trench 140 is located in the drain region.

Also referring to FIG. 2A, the trench 140 has at least two stripe regions 142 and a cross region 144 located at the intersection of the two stripe regions 142. The width w1 of the stripe region 142 is smaller than the width w2 of the cross region 144. Thereafter, as shown in FIG. 2C, a gate dielectric layer 150 is formed to line the inner surface of the trench 140. Then, as shown in FIG. 2D, a first polysilicon layer 160 is deposited in the trench 140. Since the width w1 of the stripe region 142 is smaller than the width w2 of the cross region 144, it is capable to fully fill the stripe regions 142 with the first polysilicon layer 160 of adequate thickness but leave a significant concave at the middle of the cross region 144.

Thereafter, as shown in FIG. 2E, the first polysilicon layer 160 is etched by using anisotropic etching technology to form a window 164 corresponding to the concave in the first polysilicon layer 160 as mentioned above so as to expose the bottom of the cross region 144 but leave the bottom of the stripe region 142 being totally covered by the etched polysilicon layer 162.

Then, as shown in FIG. 2F, an ion implantation process is carried out to form a doped region 165b of the second conductivity type adjacent to the cross region 144 by implanting dopants of the second conductivity type through the etched polysilicon layer 162. As a preferred embodiment, the ion implantation process can be carried out by using the etched polysilicon layer 162 as a mask, and the additional mask for defining the position of the doped region 165b can be skipped. Although a doped region 165a is also formed adjacent to the upper surface of the body 130 in the present ion implantation process, the conductivity type of the body 130 would not be altered for the conductivity type of implanted dopants is identical to that of the body 130.

Thereafter, as shown in FIG. 2G, a second polysilicon layer 170 is deposited as a whole to fill the window 164 in the trench 140. Then, the second polysilicon layer 170 is etched back to leave the polysilicon structure 172 within the trench 140 as the gate electrode of the MOSFET structure. Finally, as shown in FIGS. 2I and 2J, a plurality of source regions 180 of the first conductivity type is fowled in the body 130 and at least adjacent to the stripe portion 172a of the trenched gate 172.

Figure 5:
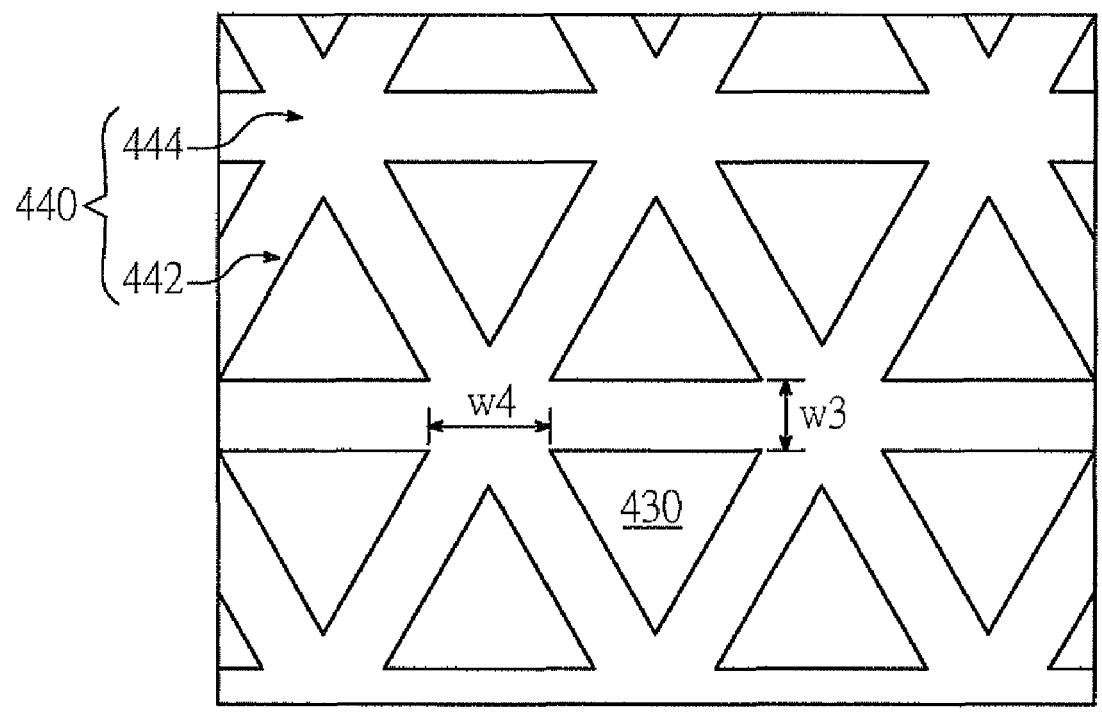
FIG. 5 is a schematic view of a closed cell trench MOSFET structure in accordance with a fourth embodiment of the present invention.

It is worth noted that as shown in FIGS. 2A and 2B, the trench 140 in the present embodiment has longitude portions and traverse portions to define a plurality of square areas in the body 130. The source regions 180 are located in the square areas. The portion of the trench 140 at the intersection of the longitude portions and the traverse portions is defined as the cross region 144, and the rest of the trench 140 is defined as the striped regions 142. As shown in the top view of the semiconductor structure, the cross region 144 shows a square shape with a side length substantially identical to the width of the stripe region 142. However, the present invention is not so restricted. The cross region 144 may have an upper surface of different shapes according to the layout of the trench 140. Referring to FIG. 5, in the fourth embodiment of the present invention, the trench 440 is sorted of three groups of different extending directions to define a plurality of triangles areas in the body 430. The source regions (not shown) are formed in the triangles areas. The cross region 444 of the trench 440 in the present embodiment has an upper surface of hexagonal shape with a width w4 greater than a width w3 of the stripe region 442 and has a side length substantially identical to the width w3.

In addition, as shown in FIGS. 2F and 2G, a drive-in step is carried out after the step of forming the second doped regions 165b below the cross region 144 of the trench 140 in accordance with the present embodiment. The drive-in step may extend the second doped region 165b to connect with the body 130. Thereby, the body 130 with the downward protruding area on the lower surface thereof is provided. However, the present invention is not so restricted. The above mentioned drive-in step is an optional step. Referring to FIG. 4, in accordance with the third embodiment of the present invention without the drive-in step being carried out, the body 330 has a first doped region 330a and a second doped region 330b, and the second doped region 330b shielding the bottom of the cross region 144 of the trench 140 is isolated from the first doped region 330a.

Figure 1A:
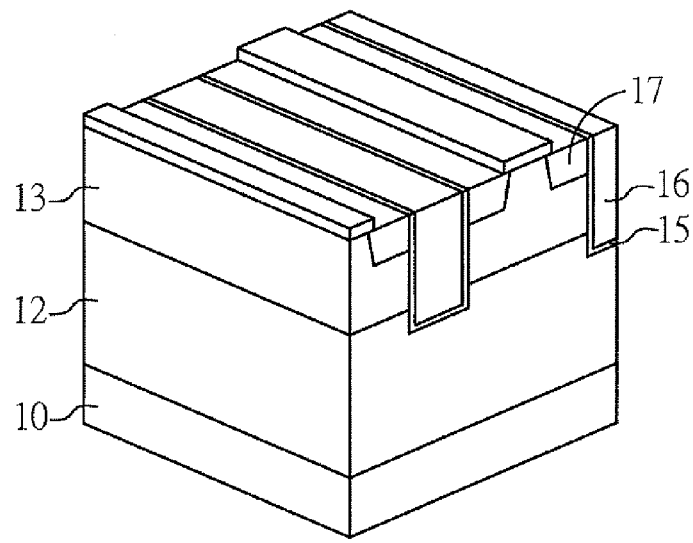
FIG. 1A is a cross-section view of a typical striped cell trench power MOSFET structure.
Figure 1B:
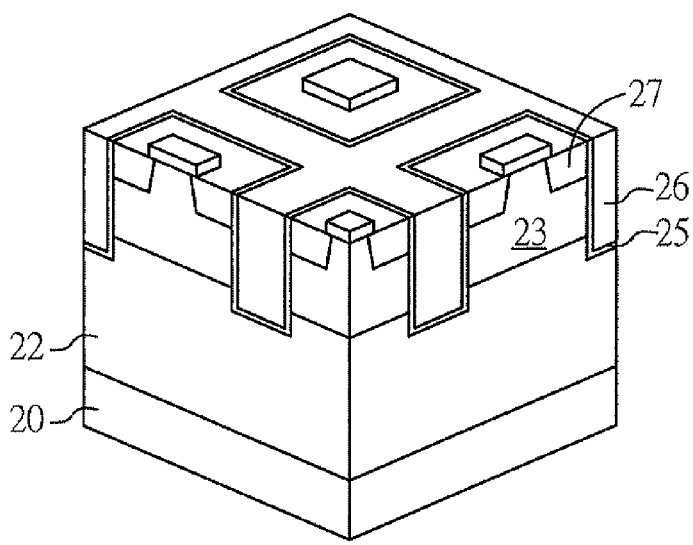
FIG. 1B is a cross-section view of a typical closed cell trench power MOSFET structure.

In contrast with the traditional closed cell trench MOSFET structure of FIG. 1B, which has a bottom of the trenched gate 26 being totally located in the drain region, referring to the closed cell trench MOSFET structure in accordance with the present invention as shown in FIG. 2I, only the bottom of the stripe portion 172a of the trenched gate 172 is located in the drain region, and the bottom of the cross portion 172b is left in the body 130 to reduce the junction area between the drain region and the gate electrode but maintain the width of the channel. As a result, by using the closed cell trench MOSFET structure in accordance with the present invention, gate-to-drain capacitance can be reduced and on-resistance can be kept low.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

What is claimed is:

1. A closed cell trench metal-oxide-semiconductor field effect transistor (MOSFET) structure, comprising:
 a drain region of a first conductivity type;
 a body of a second conductivity type, located on the drain region;
 a trenched gate, located in the body and having at least two stripe portions and a cross portion, wherein a bottom of the stripe portions is located in the drain region and a bottom of the cross portion is located in the body, and wherein the body has a flat area and at least a downward protruding area on a lower surface thereof, and the bottom of the cross portion is arranged in the correspondingly downward protruding area; and
 a plurality of source regions of the first conductivity type, located in the body and at least adjacent to the stripe portions of the trenched gate.

2. The closed cell trench MOSFET structure of claim 1, wherein the trenched gate has a depth greater than that of the body corresponding to the flat area.

3. The closed cell trench MOSFET structure of claim 1, wherein at least one of the stripe portions and the cross portion of the trenched gate have substantially identical depth.

4. The closed cell trench MOSFET structure of claim 1, wherein the body has a first doped region and a second doped region is located below the first doped region and isolated from the first doped region, the trenched gate is mainly located in the first doped region but with the bottom of the cross portion being located in the second doped region.

5. The closed cell trench MOSFET structure of claim 1, wherein the cross portion has a polygonal upper surface with a number of sides greater or equal to four.

* * * * *